(12) United States Patent
Chen

(10) Patent No.: US 9,954,355 B1
(45) Date of Patent: Apr. 24, 2018

(54) TRANSIENT VOLTAGE SUPPRESSOR APPARATUS

(71) Applicant: UBIQ Semiconductor Corp., Hsinchu County (TW)

(72) Inventor: Chih-Hao Chen, Hsinchu County (TW)

(73) Assignee: UBIQ Semiconductor Corp., Hsinchu County (TW)

( * ) Notice: Subject to any disclaimer, the term of this patent is extended or adjusted under 35 U.S.C. 154(b) by 0 days.

(21) Appl. No.: 15/439,910

(22) Filed: Feb. 22, 2017

(30) Foreign Application Priority Data

Oct. 19, 2016 (TW) .............................. 105133626 A

(51) Int. Cl.
| | |
|---|---|
| *H01L 23/498* | (2006.01) |
| *H02H 9/00* | (2006.01) |
| *H01L 23/00* | (2006.01) |
| *H01L 21/48* | (2006.01) |
| *H01L 21/56* | (2006.01) |

(52) U.S. Cl.
CPC ......... *H02H 9/005* (2013.01); *H01L 21/4821* (2013.01); *H01L 21/561* (2013.01); *H01L 21/565* (2013.01); *H01L 23/49838* (2013.01); *H01L 23/49861* (2013.01); *H01L 24/06* (2013.01); *H01L 24/49* (2013.01); *H01L 24/85* (2013.01); *H01L 24/97* (2013.01); *H01L 24/17* (2013.01); *H01L 2224/0401* (2013.01); *H01L 2224/04042* (2013.01); *H01L 2224/13111* (2013.01); *H01L 2224/13116* (2013.01); *H01L 2224/13144* (2013.01); *H01L 2224/16113* (2013.01); *H01L 2224/16227* (2013.01); *H01L 2224/48091* (2013.01); *H01L 2224/48247* (2013.01); *H01L 2224/49173* (2013.01); *H01L 2924/19011* (2013.01); *H01L 2924/19041* (2013.01); *H01L 2924/30205* (2013.01)

(58) Field of Classification Search
CPC ......... H02H 9/005; H01L 24/85; H01L 24/97; H01L 21/561; H01L 21/565; H01L 23/49838; H01L 21/4821; H01L 23/49861; H01L 24/49; H01L 24/06; H01L 2924/19041; H01L 2224/04042; H01L 2924/30205; H01L 2924/19011; H01L 2224/13111; H01L 2224/13144; H01L 24/17; H01L 2224/0401; H01L 2224/16113; H01L 2224/16227; H01L 2224/49173; H01L 2224/48247; H01L 2224/48091; H01L 2224/13116
USPC .................................................. 257/784, 734
See application file for complete search history.

(56) References Cited

U.S. PATENT DOCUMENTS

2006/0145341 A1* 7/2006 Jiang ....................... H01L 23/66
257/734
2010/0270657 A1 10/2010 Song et al.

FOREIGN PATENT DOCUMENTS

TW        I278091        4/2007

* cited by examiner

*Primary Examiner* — Caleen Sullivan
(74) *Attorney, Agent, or Firm* — JCIPRNET

(57) ABSTRACT

A transient voltage suppressor (TVS) apparatus includes a plurality of input/output (I/O) pins, a plurality of ground pins, and a substrate. The substrate includes a plurality of division parts and a carrier part. The carrier part carries a chip. The division parts are disposed between each of the I/O pins and the ground pins. The chip is electrically connected to the I/O pins and the ground pins, and the division parts are electrically insulated from the I/O pins and the ground pins.

4 Claims, 4 Drawing Sheets

TRANSIENT VOLTAGE SUPPRESSOR APPARATUS

CROSS-REFERENCE TO RELATED APPLICATION

This application claims the priority benefit of Taiwan application Ser. No. 105133626, filed on Oct. 19, 2016. The entirety of the above-mentioned patent application is hereby incorporated by reference herein and made a part of this specification.

Field of the Invention

The invention relates to a transient voltage suppressor (TVS); more specifically, the invention relates to a TVS apparatus.

Description of Related Art

Please refer to FIG. 1. FIG. 1 illustrates a chip package structure according to the related art. The package structure 100 is configured to package a chip 110 that is, for instance, a transient voltage suppressor (TVS) chip. The package structure 100 includes a plurality of ground pins GP and a plurality of input/output (I/O) pins IO1-IO4. The chip 110 has a plurality of solder pads thereon, and the solder pads are connected to the ground pins GP and the I/O pins IO1-IO4 through wire bonding. To reduce packaging costs, the ground pins GP and a lead frame 111 in the conventional package structure 100 are integrated, so as to reduce the number of wires between the chip 110 and the ground pins GP.

In the conventional package structure 100, a plurality of parasitic capacitors are formed between each of the I/O pins IO1-IO4 and an adjacent ground pin of the ground pins GP. For instance, parasitic capacitors C1-C3 are formed between the exemplary I/O pin 103 and the adjacent ground pin GP. The parasitic capacitors C1-C3 are coupled in parallel between the I/O pin IO3 and the ground pin GP. Due to the arrangement of the parasitic capacitors, noticeable equivalent capacitance is generated. Thereby, signals received by the I/O pin IO3 may be affected by the parasitic capacitors C1-C3 and may then be distorted, and signal transmission quality may be deteriorated.

In another aspect, with the requirements for the reduced number of the required pins in the package structure 100 and the narrowed gap among the pins, the equivalent capacitance generated by the parasitic capacitors is increased, and the signal transmission quality is lessened.

SUMMARY OF THE INVENTION

The invention provides a transient voltage suppressor (TVS) apparatus having a chip package structure, wherein the equivalent capacitance between input/output (I/O) pins and ground pins is reduced.

In an embodiment of the invention, a TVS apparatus includes a plurality of I/O pins, a plurality of ground pins, and a substrate. The substrate includes a carrier part and a plurality of division parts. The carrier part is configured to carry a chip. The division parts extend from the carrier part, and each of the division parts is disposed between one of the I/O pins and one of the ground pins. The chip is electrically connected to the I/O pins and the ground pins, and the division parts are electrically insulated from the I/O pins and the ground pins.

According to an embodiment of the invention, at least one first capacitor is formed between each of the I/O pins and a corresponding division part of the division parts, and a plurality of second capacitors are formed between each of the ground pins and a corresponding division part of the division parts. The at least one capacitor and the second capacitors are serially coupled.

According to an embodiment of the invention, the substrate further includes a ground part, and parts of the ground pins and the ground part are integrally formed and arranged on the substrate.

According to an embodiment of the invention, the chip has a plurality of I/O solder pads and a plurality of ground solder pads. The I/O solder pads and the ground pads are electrically connected to the I/O pins and the ground pins through wire bonding.

In view of the foregoing, the division parts are formed in a conductive substrate of the chip package structure, and each of the I/O pins is separated from one of the ground pins by the floated division parts. Thereby, the serially connected capacitors can be formed among the I/O pins, the division parts, and the ground pins, so as to reduce the capacitance of the parasitic capacitors between the I/O pins and the ground pins and better prevent signal attenuation caused by signal transmission on the I/O pins.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF EMBODIMENTS

Figure 1:
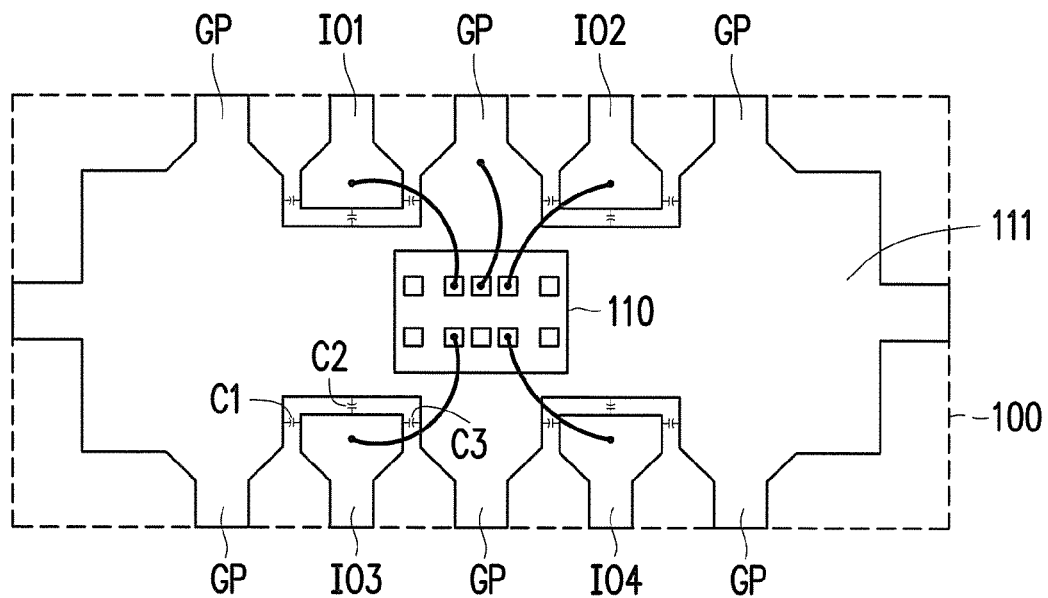
FIG. 1 illustrates a chip package structure according to the related art.
Figure 2:
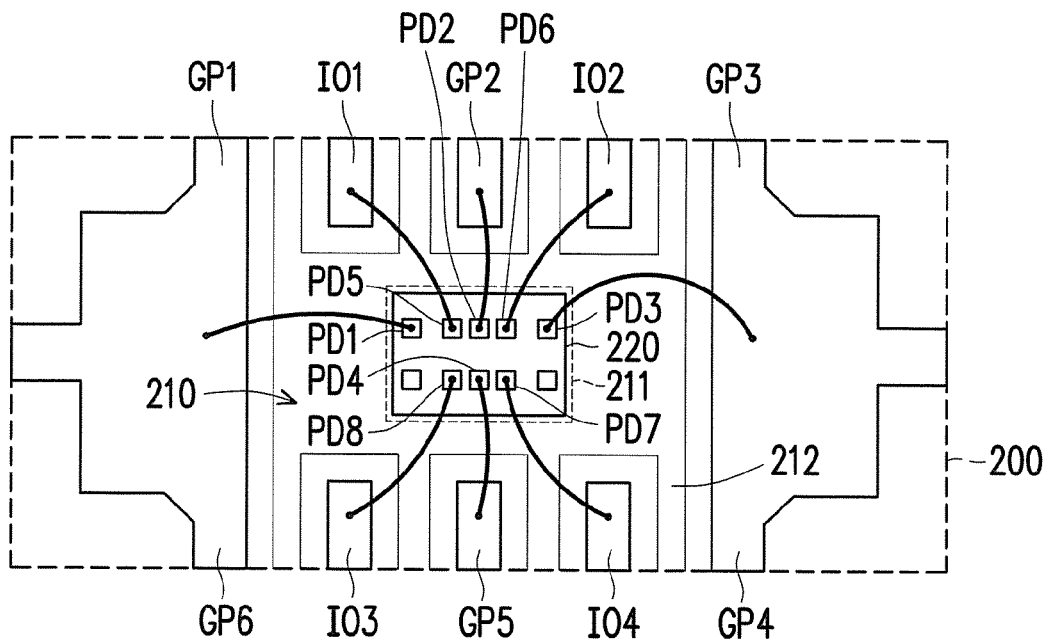
FIG. 2 is a schematic diagram of a transient voltage suppressor (TVS) apparatus according to an embodiment of the invention.

Please refer to FIG. 2. FIG. 2 is a schematic diagram of a TVS apparatus according to an embodiment of the invention. The TVS apparatus 200 includes a plurality of I/O pins IO1-IO4, a plurality of ground pins GP1-GP6, and a substrate 210. The substrate 210 includes a carrier part 211 and a plurality of division parts 212. The carrier part 211 is configured to carry a chip 220. In the present embodiment, the substrate 210 may be a conductive substrate or a lead frame, and the chip 220 may be a TVS chip. The division parts 212 are arranged between the I/O pins IO1-IO4 and the ground pins GP1-GP6. The division parts 212 are in a floated state. While the division parts 212 are in the so-called floated state, voltages in any form are not applied to the division parts 212.

In the present embodiment, the division parts 212 and the carrier part 211 are coupled, and the division parts 212 extend outwardly from the carrier part 211. The division parts 212 are arranged in a multi-finger manner (or in a herringbone-like manner) between the I/O pins IO1-IO4 and the adjacent ground pins GP1-GP6. For instance, the division parts 212 are located between the I/O pin IO1 and the adjacent ground pins GP1 and GP2 for separating the I/O pin IO1 and the adjacent ground pins GP1 and GP2. The division parts 212 are electrically insulated from the I/O pins IO1-IO4 and electrically insulated from the ground pins GP1-GP6.

The chip 220 is disposed on the carrier part 211, and the substrate of the chip 220 can be electrically insulated from the carrier part 211. A plurality of solder pads are located on a first surface of the chip 220, ground solder pads PD1-PD4 are electrically coupled to the ground pins GP1, GP2, GP3, and GP5 through a plurality of packaging wires, and I/O solder pads PD5-PD8 are electrically coupled to the I/O pins IO1-IO4 through a plurality of packaging wires.

The TVS apparatus 200 may include a package cover to cover the I/O pins IO1-IO4, the ground pins GP1-GP6, the conductive substrate 10, and the chip 220.

Figure 3A:
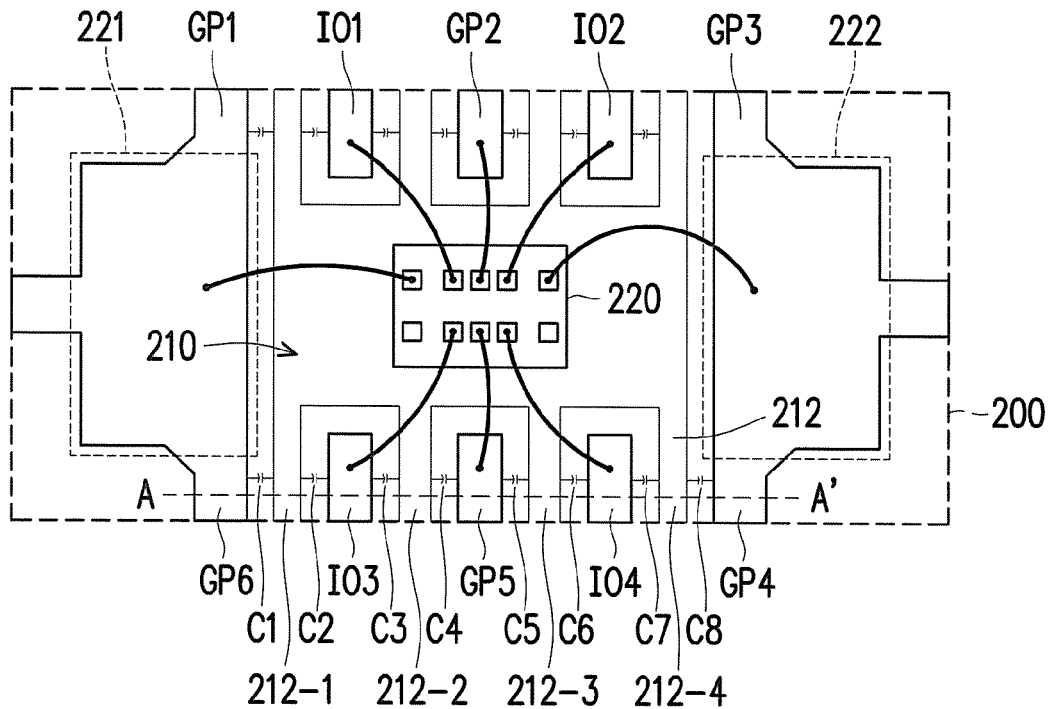
FIG. 3A is a schematic diagram illustrating a parasitic capacitor in the TVS apparatus 200 according to the embodiment depicted in FIG. 2.
Figure 3B:
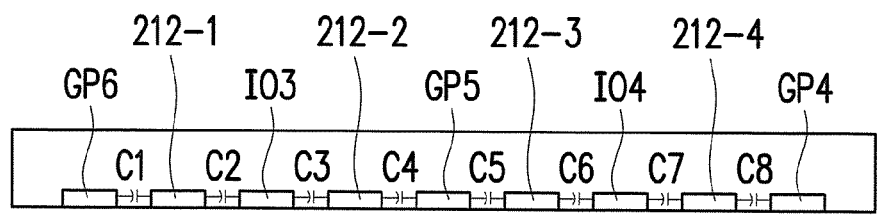
FIG. 3B is a cross-sectional view taken along a line segment A-A' in FIG. 3A.

Please refer to FIG. 3A and FIG. 3B. FIG. 3A is a schematic diagram illustrating a parasitic capacitor in the TVS apparatus 200 according to the embodiment depicted in FIG. 2. FIG. 3B is a cross-sectional view taken along a line segment A-A' in FIG. 3A. As shown in FIG. 3A, by the division parts 212-1-212-4 which have potential different form the I/O pins IO1-IO4 and the ground pins GP1-GP6, a plurality of parasitic capacitors are formed between the I/O pins IO1-IO4 and the adjacent division parts 212-1-212-4 and between the ground pins GP1-GP6 and the adjacent division parts 212-1-212-4.

As shown by the line segment A-A' in FIG. 3B, the parasitic capacitor C1 is formed between the ground pin GP6 and the division part 212-1, the parasitic capacitor C2 is formed between the I/O pin IO3 and the division part 212-1, the parasitic capacitor C3 is formed between the I/O pin IO3 and the division part 212-2, the parasitic capacitor C4 is formed between the ground pin GP5 and the division part 212-2, the parasitic capacitor C5 is formed between the ground pin GP5 and the division part 212-3, the parasitic capacitor C6 is formed between the I/O pin IO4 and the division part 212-3, the parasitic capacitor C7 is formed between the I/O pin IO4 and the division part 212-4, and the parasitic capacitor C8 is formed between the ground pin GP4 and the division part 212-4.

Since the potential of the division parts is different from the potential of the I/O pins and the potential of the ground pins (e.g., floated), the arrangement of the division parts between the I/O pins and the ground pins allows the parasitic capacitors between the I/O pins and the adjacent ground pins to become serially coupled parasitic capacitors. For instance, two serially coupled parasitic capacitors C2 and C1 are located between the I/O pin IO3 and the ground pin GP6, and two serially coupled parasitic capacitors C3 and C4 are located between the I/O pin IO3 and the ground pin GP5. The equivalent capacitance CE between the I/O pin IO3 and the ground pin may be represented as:

$$CE = \frac{1}{\frac{1}{C1}+\frac{1}{C2}} + \frac{1}{\frac{1}{C3}+\frac{1}{C4}} + C_{DIE},$$

wherein $C_{DIE}$ is the parasitic capacitance provided by the chip 220.

As provided above, the equivalent capacitance of the parasitic capacitors between the I/O pins IO1-IO4 and the ground pins can be effectively decreased, and signal distortion (caused by the parasitic capacitors) on the I/O pins IO1-IO4 can be significantly reduced.

From another perspective, to reduce the number of the packaging wires between the chip 220 and the ground pins GP1-GP6, one or more ground parts 221 and 222 may be arranged in the TVS apparatus 200 according to an embodiment of the invention. Some of the pins GP1-GP6 (e.g., the ground pins GP1 and GP6) may be connected to the ground part 221, and other ground pins (e.g., the ground pins GP3 and GP4) are connected to the ground part 222. If the ground solder pads on the chip 220 are required to be electrically connected to the ground pins GP1 and GP6, the ground solder pads may be connected to the ground part 221 through one packaging wire, and thereby the ground solder pads on the chip 220 can be electrically coupled to the ground pins GP1 and GP6 through one packaging wire. Owing to the ground parts 221 and 222, the connectible range of the ground pins GP1 and GP6 and the ground pins GP3 and GP4 can be expanded. Thereby, the length of the packaging wires connected to the ground pins GP1, GP6, GP3, and GP4 can be reduced, and thus possible inductance resulting from the packaging wire may be prevented to a better extent.

In the TVS apparatus 200, the ground part 221 and the ground pins GP1 and GP6 may be formed by one conductive metal layer made of one material and may be integrally formed. The ground part 222 and the ground pins GP3 and GP4 may be formed by one conductive metal layer made of one material and may be integrally formed. In other words, the arrangement of the ground parts 221 and 222 does not complicate the manufacture of the TVS apparatus 200.

Figure 4:
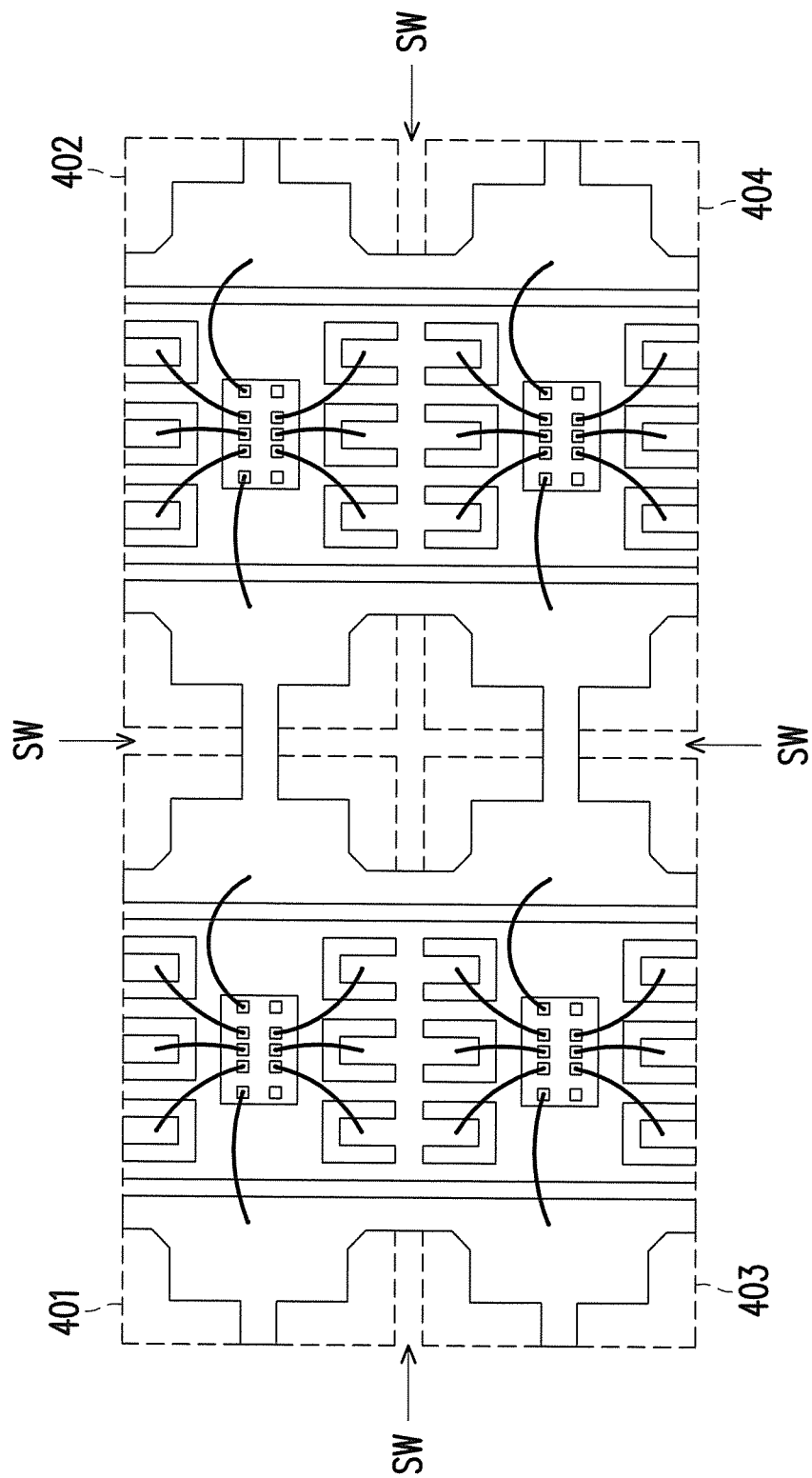
FIG. 4 is a schematic diagram illustrating a manufacturing method of the TVS apparatus 200 according to the embodiment depicted in FIG. 2 and FIG. 3.

Please refer to FIG. 4. FIG. 4 is a schematic diagram illustrating a manufacturing method of the TVS apparatus according to the embodiment depicted in FIG. 2 and FIG. 3. In FIG. 4, a lead frame array includes a plurality of lead frames 401-404. During the process of manufacturing the TVS apparatus, a plurality of chips are held by the lead frames 401-404. A wire bonding process and a compound molding process are implemented, and a cutting process is performed along cutting way SW (shown by dotted lines in FIG. 4) to obtain a plurality of TVS apparatuses.

Figure 5A:
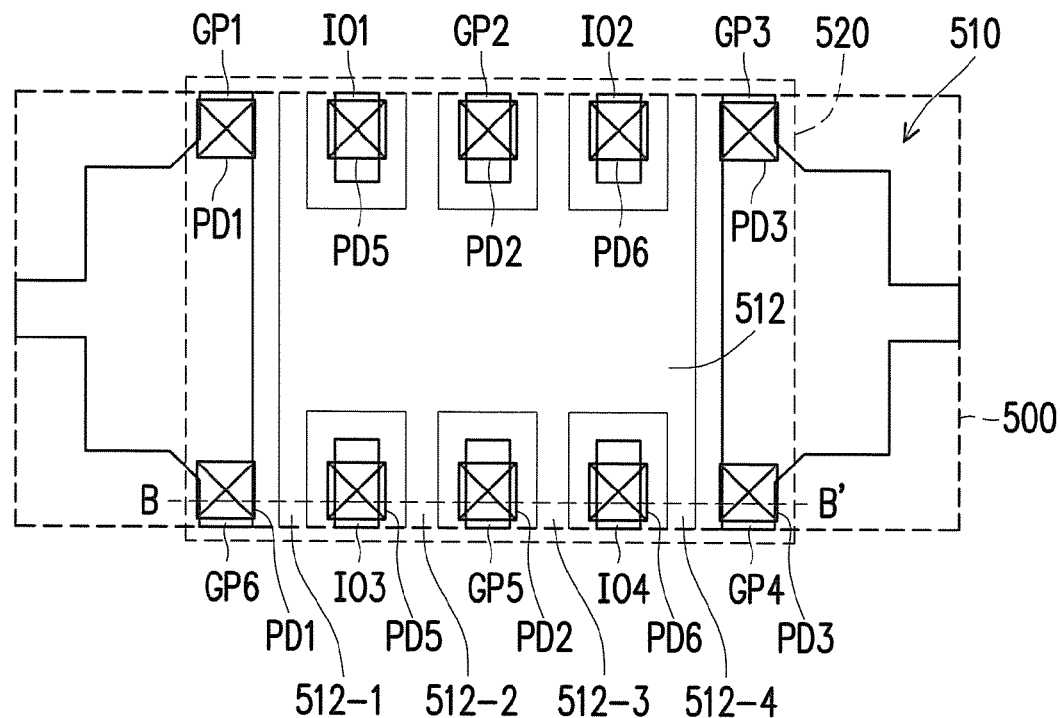
FIG. 5A is a schematic diagram of a TVS apparatus according to another embodiment of the invention.
Figure 5B:
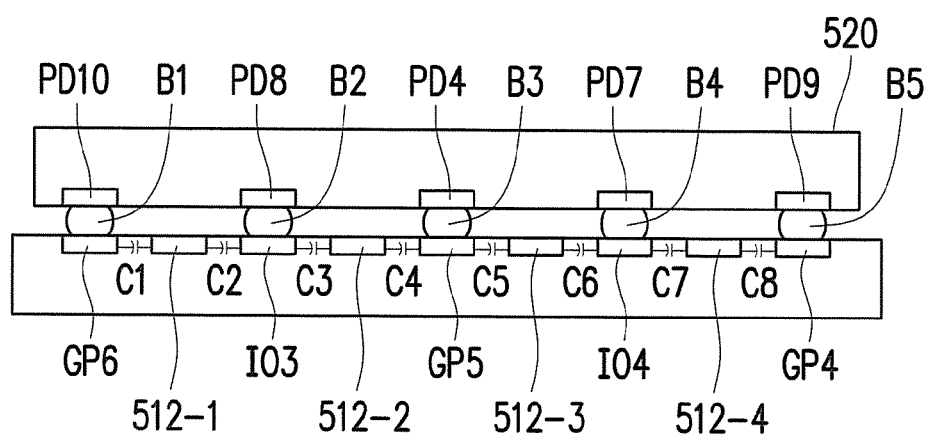
FIG. 5B is a cross-sectional view taken along a line segment B-B' in FIG. 5A.

Please refer to FIG. 5A and FIG. 5B. FIG. 5A is a schematic diagram illustrating a TVS apparatus according to another embodiment of the invention, and FIG. 5B is a cross-sectional view taken along a line segment B-B' in FIG. 5A. In FIG. 5A, the chip 520 is formed in the TVS apparatus 500 through flip-chip packaging. Flip-chip packaging is a packaging technology through which the chip can be directly connected to the substrate. During the packaging process, the chip is turned upside down, such that the solder pads on the active surface of the chip are directly connected to the circuit patterns (e.g., printed circuits of a printed circuit board) on the substrate.

The TVS apparatus 500 includes a substrate 510, and the substrate 510 includes a plurality of I/O pins IO1-IO4, a plurality of ground pins GP1-GP6, and a division part 512. The division part 512 includes branches 512-1-512-4. The I/O pins IO1-IO4 are respectively separated from the adjacent ground pins GP1-GP6 through the branches 512-1-512-4. Each of the branches 512-1-512-4 is electrically insulated from the I/O pins IO1-IO4 and electrically insulated from the ground pins GP1-GP6 and is in the floated state because no voltage is applied in any form to the branches 512-1-

512-4. Thereby, the equivalent capacitance provided by the parasitic capacitors between the I/O pins IO1-IO4 and the ground pins GP1-GP6 can be reduced.

The I/O solder pads PD5-PD8 and the solder pads PD1-PD4, PD9, and PD10 on the chip 520 are bonded to the ground pins GP1-GP6 and the I/O pins IO1-IO4. As shown by the line segment B-B' in FIG. 5B, the ground solder pad PD10, the I/O solder pad PD8, the ground solder pad PD4, the I/O solder pad PD7, and the ground solder pad PD9 are electrically coupled to the ground pin GP6, the I/O pin IO3, the ground pin GP5, the I/O pin IO4, and the ground pin GP4 through conductive bumps B-1-B-4, respectively.

In the present embodiment, the parasitic capacitor C1 is formed between the ground pin GP6 and the branch 512-1, the parasitic capacitor C2 is formed between the I/O pin IO3 and the branch 512-1, the parasitic capacitor C3 is formed between the I/O pin IO3 and the branch 512-2, the parasitic capacitor C4 is formed between the ground pin GP5 and the branch 512-2, the parasitic capacitor C5 is formed between the ground pin GP5 and the branch 512-3, the parasitic capacitor C6 is formed between the I/O pin IO4 and the branch 512-3, the parasitic capacitor C7 is formed between the I/O pin IO4 and the branch 512-4, and the parasitic capacitor C8 is formed between the ground pin GP4 and the branch 512-4. That is, two serially connected parasitic capacitors may be located between any of the I/O pins and the adjacent ground pins, so as to reduce the equivalent capacitance provided by the parasitic capacitors between any of the I/O pins and the adjacent ground pins.

The conductive bumps B1-B4 may be gold bumps, tin-lead balls, or the conductive bumps that are made of any material and may be configured to perform electrical connection in flip-chip packaging, as known to people having ordinary skill in the pertinent art.

To sum up, the floated division parts are configured between each of the I/O pins and the adjacent ground pin. Since the potential of the (e.g., floated) division parts is different from the potential of the I/O pins and the potential of the ground pins, the arrangement of the division parts between the I/O pins and the ground pins allows the parasitic capacitors between the I/O pins and the adjacent ground pins to become serially coupled parasitic capacitors, and the equivalent capacitance provided by the parasitic capacitors between the I/O pins and the ground pins can be effectively reduced. As such, the impact of the parasitic capacitors on distortion of signals transmitted on the I/O pins can be lessened, and the signal transmission accuracy can be enhanced.

It will be apparent to those skilled in the art that various modifications and variations can be made to the disclosed embodiments without departing from the scope or spirit of the invention. In view of the foregoing, it should be mentioned that the invention covers modifications and variations of this disclosure provided that they fall within the scope of the following claims and their equivalents.

What is claimed is:

1. A transient voltage suppressor apparatus comprising:
    a plurality of input/output pins;
    a plurality of ground pins; and
    a substrate comprising:
        a carrier part carrying a chip; and
        a plurality of division parts extending from the carrier part, each of the division parts being disposed between one of the input/output pins and one of the ground pins,
    wherein the chip is electrically connected to the input/output pins and the ground pins, and the division parts are electrically insulated from the input/output pins and the ground pins.

2. The transient voltage suppressor apparatus according to claim 1, wherein at least one first capacitor is formed between each of the input/output pins and a corresponding division part of the division parts, a plurality of second capacitors are formed between each of the ground pins and a corresponding division part of the division parts, and the at least one first capacitor and the second capacitors are serially coupled.

3. The transient voltage suppressor apparatus according to claim 1, wherein the substrate further comprises a ground part, and parts of the ground pins and the ground part are integrally formed.

4. The transient voltage suppressor apparatus according to claim 1, wherein the chip has a plurality of input/output solder pads and a plurality of ground solder pads, and the input/output solder pads and the ground solder pads are electrically connected to the input/output pins and the ground pins through wire bonding.

\* \* \* \* \*